(12) United States Patent
Steensgaard-Madsen

(10) Patent No.: US 11,171,662 B1
(45) Date of Patent: Nov. 9, 2021

(54) ANALOG-TO-DIGITAL CONVERSION CIRCUIT WITH IMPROVED LINEARITY

(71) Applicant: Analog Devices, Inc., Norwood, MA (US)

(72) Inventor: Jesper Steensgaard-Madsen, Sequim, WA (US)

(73) Assignee: ANALOG DEVICES, INC., Wilmington, MA (US)

( * ) Notice: Subject to any disclaimer, the term of this patent is extended or adjusted under 35 U.S.C. 154(b) by 0 days.

(21) Appl. No.: 16/990,521

(22) Filed: Aug. 11, 2020

(51) Int. Cl.
*H03M 1/38* (2006.01)
*H03M 1/46* (2006.01)
*H03M 1/12* (2006.01)

(52) U.S. Cl.
CPC ......... *H03M 1/466* (2013.01); *H03M 1/1245* (2013.01)

(58) Field of Classification Search
CPC ....... H03M 1/466; H03M 1/1245; H03M 1/66
USPC ................. 341/155, 144, 161, 122
See application file for complete search history.

(56) References Cited

U.S. PATENT DOCUMENTS

| | | | |
|---|---|---|---|
| 5,684,482 A | 11/1997 | Galton | |
| 6,348,884 B1 | 2/2002 | Steensgaard-Madsen | |
| 6,954,169 B1 | 10/2005 | Min | |
| 7,009,549 B1 | 3/2006 | Corsi | |
| 7,705,765 B1 | 4/2010 | Yang | |
| 7,719,452 B2* | 5/2010 | Bardsley | H03M 1/0695 341/131 |
| 8,232,905 B2 | 7/2012 | Steensgaard-Madsen | |
| 8,576,104 B2 | 11/2013 | Steensgaard-Madsen et al. | |
| 8,810,443 B2 | 4/2014 | Steensgaard-Madsen | |
| 9,054,727 B2 | 6/2015 | Steensgaard-Madsen | |
| 9,231,611 B2 | 1/2016 | Steensgaard-Madsen | |
| 9,331,709 B2 | 5/2016 | Steensgaard-Madsen | |
| 10,483,995 B1* | 11/2019 | Lok | H03M 1/1038 |

OTHER PUBLICATIONS

Notice of Allowance mailed in U.S. Appl. No. 16/990,410 dated Mar. 29, 2021, 10 pages.

* cited by examiner

*Primary Examiner* — Peguy Jean Pierre
(74) *Attorney, Agent, or Firm* — Patent Capital Group

(57) ABSTRACT

Herein disclosed is an example analog-to-digital converter (ADC) and methods that may be performed by the ADC. The ADC may derive a first code that approximates a combination of an analog input value of the ADC and a dither value for the ADC sampled on a capacitor array. The ADC may further derive a second code to represent a residue of the combination with respect to the first code applied to the capacitor array. The ADC may combine the numerical value of the first code and the numerical value of the second code to produce a combined code applied to the capacitor array for deriving a digital output code. Combining the numerical value of the first code and the numerical value of the second code in the digital domain can provide for greater analog-to-digital (A/D) conversion linearity.

20 Claims, 3 Drawing Sheets

ANALOG-TO-DIGITAL CONVERSION CIRCUIT WITH IMPROVED LINEARITY

FIELD OF THE DISCLOSURE

This disclosure relates in general to the field of analog-to-digital converters, and more particularly, though not exclusively, to precision analog-to-digital conversion circuits.

BACKGROUND

Analog signals and/or values can be produced in various kinds of circuit elements, for example, signal generators, sensors, and antennas. However, there can be many instances where having digital signals or values can be beneficial, such as for a processing or storing of the signals or values. To utilize the benefits of having a digital signal or value when an analog signal or value has been produced, analog-to-digital conversion circuits (ADCs) have been developed to convert the analog signal or value into a digital signal or value.

A signal may be a time-based sequence of values. A digital value may be represented by a code. A name of a code, such as CODE1, may refer to a digital (numerical) value represented by that code. Some (but not all) digital values may be represented by codes using conventional binary-weighted encoding. A resolution (which may be short for a "numerical resolution") of a digital value or code expressed in terms of a number of bits may refer to a binary-weighted encoding regardless of how it may be physically encoded. A physical resolution may refer to a number of physical bits used to physically encode a digital value. For example, a digital value of an example code CODE1 may be encoded by 8 bits using thermometer encoding. A physical resolution of the example CODE1 may be 8 bits. A weight of each of the 8 bits may be 1/8, and a set of possible numerical values that CODE1 can represent may be 0/8, 1/8, 2/8, 3/8, 4/8, 5/8, 6/8, 7/8, 8/8. The 9 possible numerical values are uniformly spaced, and a (numerical) resolution of CODE1 may be expressed as $\log_2(9) \approx 3.17$ bits. In some instances, without loss of clarity, a resolution may be rounded to a nearest integer number of bits. For example, a resolution of the example CODE1 may be "approximately 3 bits" or simply "3 bits".

In many electronics applications, analog input values are converted to digital output values (for example, for further digital processing or storage). For instance, in precision measurement systems, electronics are provided with one or more sensors to make measurements, and these sensors may generate analog values. The analog values may be provided as an input to an ADC to generate digital output values for further processing or storage.

ADCs can be found in many places such as broadband communication systems, automated test equipment, audio systems, vehicles, factory-automation systems, etc. ADCs can translate analog electrical values representing real-world phenomena, such as, light, sound, temperature, flow, or pressure. Designing an ADC is a non-trivial task because each application may have different needs in speed, performance, power, cost and size. As the applications needing ADCs grow, the need for accurate and reliable conversion performance also grows.

Some applications may require precise and accurate conversion of analog values, creating a need for precision ADCs (precision meaning precise and/or accurate). Required specifications for a precision ADC may include a small (ideally zero) nonlinearity error. A nonlinearity error (sometimes called Integral-Non-Linearity, or INL, error) may characterize an ADC's deviation from providing a linear relationship between analog input values (VIN) and digital output values (DOUT) within a predefined range. A linear relationship may be DOUT=VIN/VSCALE+OFFSET, where VSCALE may be an analog scaling quantity (for example, VSCALE may be nominally a reference voltage) and OFFSET may be a constant value. Mismatch of capacitance ratios of capacitors in a capacitive digital-to-analog converter (CDAC) may contribute significantly to a non-linearity error.

U.S. Pat. Nos. 8,810,443, 9,054,727, 9,231,611, and 9,331,709 to Steensgaard-Madsen teach in part how to make SAR ADCs (successive-approximation-register ADCs) substantially linear despite potential mismatch of CDAC capacitance ratios. Steensgaard-Madsen writes (U.S. Pat. No. 8,810,443; col. 21; lines 62-65) that the teachings may be combined with the teachings of U.S. Pat. No. 8,232,905 (substitute for publication U.S. 2011/0115661 A1), also to Steensgaard-Madsen. A person having ordinary skill in the art may conceive of a combination of the teachings of U.S. Pat. No. 8,232,905 (Pat. No. '905) and U.S. Pat. No. 8,810,443 (Pat No. '443) to increase a maximum conversion rate and/or to improve a power efficiency of an ADC. For example, a person having ordinary skill in the art may conceive of a combination of a legacy sequentially configured analog-to-digital converter with features of a legacy analog-to-digital converter system, having a sampling digital-to-analog converter to sample a combination of an analog signal value and an analog dither, and a mismatch-shaping encoder to increase a maximum conversion rate and/or improve a power efficiency of an ADC. However, in such a combination, analog imperfections such as nonlinearity and/or deviation of a gain factor of a multibit quantizer (for example, 214 in FIG. 4 of Pat. No. '905) may cause a deviation from desired properties, including deviation from a set of desired statistical properties described in a paragraph of Pat. No. '443 starting on line 37 in col. 12 with reference to FIG. 5. Accordingly, approximations described in Pat. No. '443 lines 10-15, col. 13 of assumptions made may potentially become too coarse and a degree of nonlinearity due to mismatch of CDAC capacitance ratios may exceed a level that may be required for an application. Use of over-range (also known as redundancy) as described in U.S. Pat. Nos. 8,232,905, 8,810,443, 9,054,727, 9,231,611, and 9,331,709 may also cause some deviation from desired statistical properties and may result in nonlinearity error.

BRIEF DESCRIPTION OF THE DRAWINGS

The present disclosure is best understood from the following detailed description when read with the accompanying figures. It is emphasized that, in accordance with the standard practice in the industry, various features are not necessarily drawn to scale, and are used for illustration purposes only. Where a scale is shown, explicitly or implicitly, it provides only one illustrative example. In other embodiments, the dimensions of the various features may be arbitrarily increased or reduced for clarity of discussion.

SUMMARY OF THE DISCLOSURE

Figure 1:
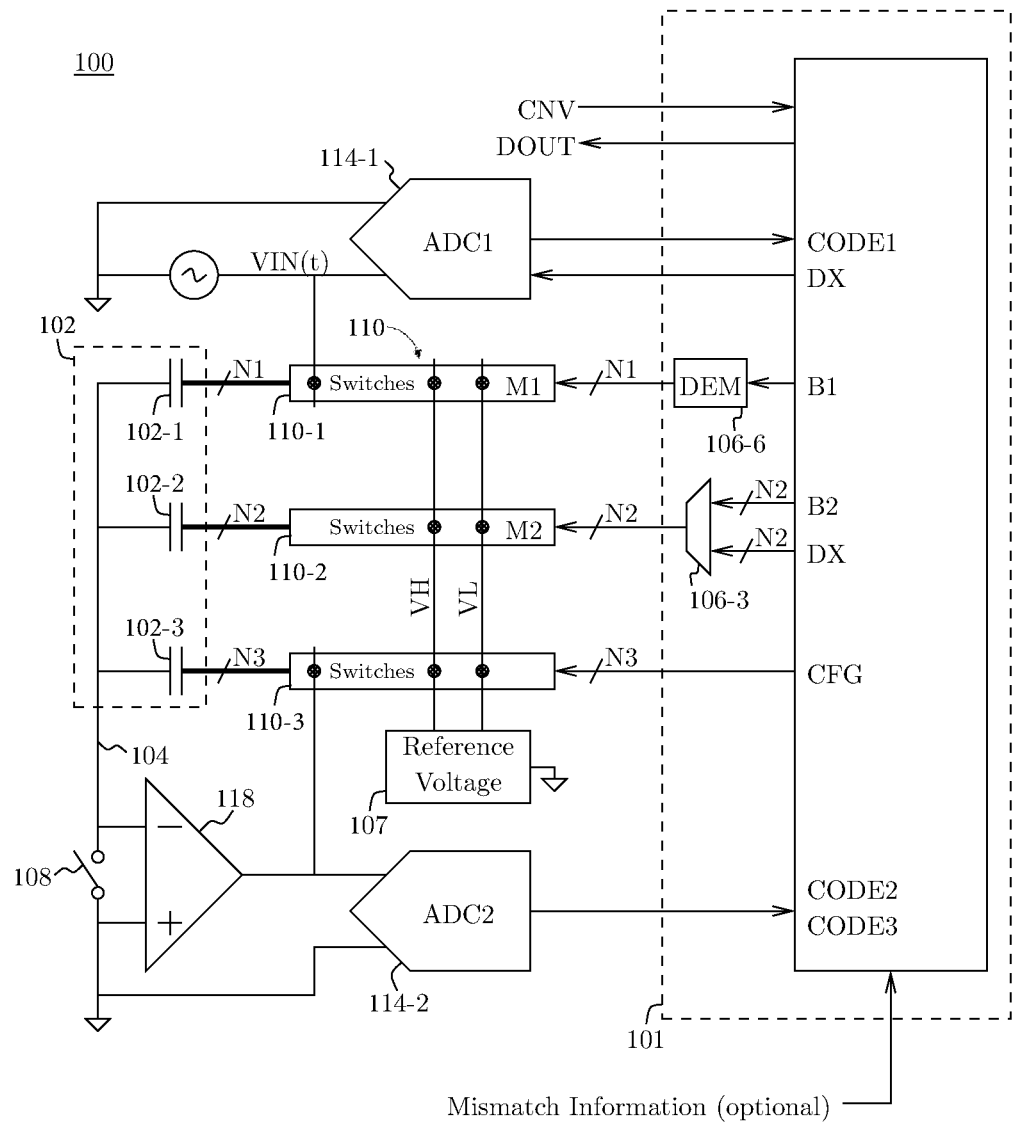
FIG. 1 shows an example ADC according to various embodiments.

Herein disclosed is an example analog-to-digital converter (ADC) and methods that may be performed by the ADC. The ADC may derive a first code that approximates a combination of an analog input value of the ADC and a dither value for the ADC. The ADC may further derive a second code to represent a residue of the combination with respect to the first code. The ADC may combine the numerical value of the first code and the numerical value of second code to produce a combined code to be applied to a capacitor array. Combining the numerical value of the first code and the numerical value of the second code in the digital domain can provide for greater linearity within the ADC.

Disclosed herein is a method for providing a digital output code to represent an analog input value. The method may include sampling a combination of the analog input value and a dither value on a node of a capacitor array, deriving a first code approximating the combination of the analog input value and the dither value, and applying a first segment of the first code to a first segment of the capacitor array, and applying a second segment of the first code to a second segment of the capacitor array. The method may further include deriving a second code to represent a first residue of the combination of the analog input value and the dither value, the first residue being with respect to the first code applied to the capacitor array, combining a numerical value of the first code and a numerical value of the second code to derive a combined code, and applying a first segment of the combined code to the first segment of the capacitor array, and applying a second segment of the combined code to the second segment of the capacitor array, wherein the first segment of the combined code and the second segment of the combined code are responsive to the second code. The method may further include deriving a third code to represent a second residue of the combination of the analog input value and the dither value, the second residue being with respect to the combined code applied to the capacitor array, and combining the third code with the combined code and a dither code representing the dither value to provide the digital output code.

Disclosed herein is an analog-to-digital converter (ADC). The ADC may include a capacitor array comprising a plurality of capacitors, and a control circuit coupled to the capacitor array. The control circuit may determine a first code based on an analog input value of the ADC and a dither value, the first code to approximate the combination of the analog input value and the dither value, and determine a second code based on a residue of the combination of the analog input value and the dither value, the residue being with respect to the first code, and the second code to represent the residue. The control circuit may further combine a numerical value of the first code and a numerical value of the second code to produce a combined code, and determine a digital output code based at least in part on the combined code and a dither code, the dither code to represent the dither value.

DETAILED DESCRIPTION

The following disclosure provides many different embodiments, or examples, for implementing different features of the present disclosure. Specific examples of components and arrangements are described below to simplify the present disclosure. These are, of course, merely examples and are not intended to be limiting. Further, the present disclosure may repeat reference numerals and/or letters in the various examples, or in some cases across different figures. This repetition is for the purpose of simplicity and clarity and does not in itself dictate a specific relationship between the various embodiments and/or configurations discussed. Different embodiments may have different advantages, and no particular advantage is necessarily required of any embodiment.

FIG. 1 shows an example ADC 100 according to various embodiments. Several elements of ADC 100 may have similar features with elements of an ADC 200 shown in FIG. 2 of Pat. No. '443. For example, in ADC 100 of FIG. 1, a CDAC capacitor array 102 of the ADC 100 may comprise a first segment 102-1 that may comprise a number N1 of nominally equal-sized (may be also referred to as unit-sized) capacitors. The number N1 of nominally equal-sized capacitors within the first segment 102-1 may include a plurality of capacitors, where the capacitors are nominally equal-sized (in other words, present a nominally equal capacitance). In ADC 200 in Pat. No. '443, a first segment 201-1 (FIG. 2 of Pat. No. '443) may comprise N1=4 equal-sized capacitors of nominal size C/4 each. The CDAC capacitor array 102 may further comprise a second segment 102-2, which may comprise a number N2 of nominally binary-weighted capacitors. A combined nominal capacitance of all capacitors in the second segment 102-2 may be substantially equal to a nominal capacitance of one unit-sized capacitor in the first segment 102-1. For example, the number N2 of nominally binary-weighted capacitors within the second segment 102-2 may include a plurality of capacitors, where a combined nominal capacitance of the capacitors within the second segment 102-2 may be substantially equal to a nominal capacitance of a single capacitor within the first segment 102-1. In ADC 200 in Pat. No. '443, a second segment 201-2 may comprise N2=6 binary-weighted capacitors. A combined nominal capacitance of the second segment 201-2 in Pat. No. '443 may be 63C/256, which may converge towards a nominal capacitance C/4 of a unit-sized capacitor for an anticipated larger value of N2. The CDAC capacitor array 102 may further include a third segment 102-3. The third segment 102-3 of CDAC capacitor array 102 in ADC 100 may be not equivalent to any part of ADC 200 in Pat. No. '443, but it may have similarities to capacitor 215, capacitor 216, and/or capacitor 217 of ADC 200 in FIG. 4 of Pat. No. '905. Each of the first segment 102-1, the second segment 102-2, and the third segment 102-3 may have a first connection of each of the capacitors in each of the segments coupled to a common node 104 and a second connection of each of the capacitors in each of the segments coupled to a corresponding plurality of switches for each capacitor in each segment. The ADC 100 of FIG. 1 herein and the ADC 200 of FIG. 2 in Pat. No. '443 may both include a circuit (circuit 107 of the ADC 100 herein and circuit 207 of the ADC 200 in Pat. No. '443) for providing a plurality of reference potentials (such as, VL=0 volts (V) and VH=5V), which may be referred to a reference circuit. For the ADC 100 in FIG. 1, an input voltage VIN(t) may be applied across one, several, or all capacitors in the first segment 102-1 during an acquisition phase, which may end at a sampling instance when a sampling switch 108 opens (becomes non-conductive) in response to a transition of a control signal CNV that may be applied as an input to ADC 100. For example, switches 110-1, that may be coupled to a connection of the capacitors within the first segment 102-1, may cause an input voltage VIN(t) of the ADC 100 to be applied to one or more of the capacitors within the first segment 102-1 during the acquisition phase. In Pat. No. '443, VIN(t) may be applied across all capacitors in the first segment 201-1, and a sampling switch 208 may open at a sampling instance in response to a transition of a control signal CNV. Furthermore, in the ADC 100, an N2-bit digital dither value DX may be applied to the second segment 102-2 via a multiplexer circuit 106-3. In Pat. No. '443, a 6-bit (N2=6) dither value DX (bits x5, x6, x7, x8, x9, x10 in FIG. 3 of Pat. No. '443) may be applied via multiplexer circuit 206-3 (FIG. 3 of Pat. No. '443) and switch drivers 206-5 (FIG. 3 of Pat No. '443) to the second segment 201-2 (FIG. 2 of Pat. No. '443). FIG. 1 herein does not show any switch drivers explicitly within the ADC 100, but persons having ordinary skill in the art (PHOSITA) will understand that they may be included implicitly. A PHOSITA will further recognize that CDAC circuits may be implemented in various ways, and that an input of a CDAC circuit may be characterized by an equivalent capacitance or weight of the input (some examples described in Pat. No. '443 and Pat No. '905), which may be not equal to a physical capacitance. For example, it is well-known that one or more coupling capacitors may be configured internally in a CDAC to effectively reduce a weight for an input terminal that it connected to a physical capacitor that may be larger than the weight may otherwise suggest.

In ADC 200 of Pat. No. '443, a code M (bits m1, m2, . . . , m10 in FIG. 3 of Pat. No. '443) may be applied to CDAC capacitor array 201 (FIG. 2 of Pat. No. '443) during a conversion operation. Code M may be updated during the conversion operation in a plurality of conversion steps involving successive approximation. A first segment M1 of code M (bits m1, m2, m3, m4) may be provided via a scrambler circuit 206-6 (FIG. 3 of Pat. No. '443) processing a code B1 (bits b1, b2, b3, b4) provided by a control circuit 206-1 (FIG. 3 of Pat. No. '443). A second segment M2 of code M (bits m5, m6, . . . , m10) may be provided via multiplexer circuit 206-3 (FIG. 3 of Pat. No. '443) receiving an equal code B2 (bits b5, b6, . . . , b10) from control circuit 206-1 (FIG. 3 of Pat. No. '443). The first and second segments of code M may be applied to the first and second segments of CDAC capacitor array 201 (FIG. 2 of Pat. No. '443). Switch drivers and switches may be configured to selectively apply a reference potential (either VH or VL) to each capacitor in CDAC capacitor array 201 (FIG. 2 of Pat. No. '443) according to a corresponding bit of code M. ADC 100 of FIG. 1 herein may be configured to provide a similar fundamental operation with relation to the code M of ADC 200 of Pat. No. '443. A control circuit 101 may provide a digital code B comprising a first segment B1 and a second segment B2. The digital code B may comprise a plurality of bits, where the first segment B1 may comprise a first portion of the digital code B and the second segment B2 may comprise a second portion of the digital code B. The codes may represent numerical values B=B1+B2. The first segment B1 of digital code B may be processed by a scrambler circuit 106-6 providing a code M1 having N1 physical bits to control switches to selectively apply a reference potential (VH or VL) to each of the N1 unit-sized capacitors in the first CDAC segment 102-1. For example, the first segment B1 of digital code B may be applied to the scrambler circuit 106-6 and an output M1 of the scrambler circuit 106-6 may cause the switches 110-1 to couple each of the capacitors of the first segment 102-1 to either reference potential VH or reference potential VL based on code M1 derived from a value of the first segment B1. The second segment B2 of digital code B may be transferred via multiplexer circuit 106-3 providing a code M2 to control switches 110-2 to selectively apply a reference potential (VH or VL) to each of the N2 nominally binary-weighted capacitors 102-2. For example, the second segment B2 of digital code B may be applied to the multiplexer circuit 106-3 and each individual bit at an output of the multiplexer 106-3 may cause the switches 110-2 to couple each individual capacitor in the second segment 102-2 to either reference potential VH or reference potential VL based on each individual bit (collectively representing a numerical value B2) of the second segment B2. A physical resolution of first segment B1 may be (but need not be) N1 bits, and first segment B1 may be (but need not be) a thermometer-type code. For example, the first CDAC segment 102-1 may comprise 32 capacitors each of a nominal size C/32 (a nominal unit-size capacitor may be 1 pico-Farad (pF), in other words, C=32 pF). A numerical value of B1 may be one of 33 possible numerical values (for example, 0/32, 1/32, 2/32, 3/32, . . . , 32/32) and scrambler circuit 106-6 may output code M1 encoded as 32 bits each having a weight of 1/32. Code M1 may be an equal-weighted code. A numerical value of code M1 may be equal to a numerical value of code B1. Scrambler circuit 106-6 may be a tree-type mismatch-shaping encoder receiving code B1 encoded as 6 bits with 6 corresponding weights: 16/32, 8/32, 4/32, 2/32, 1/32, and 1/32. Tree-type mismatch-shaping encoders are described in U.S. Pat. No. 5,684,482, which is incorporated herein by reference. For example, the tree-type mismatch-shaping encoders may comprise one or more switching blocks, where the switching blocks can be separated into a plurality of layers and switching blocks within one layer are coupled to switching blocks in adjacent layers. The switching blocks may receive an input signal and may split the signal into one or more n-bit output signals, where n is the number of bits, output by the switching blocks. The number of output signals and the number of bits in each output signal may differ between the layers of the switching blocks. The tree-type mismatch-shaping encoders may have an input applied to a first layer of the switching blocks and may propagate through the layers of the switching blocks being split at each of the layers to a final layer that produces an output of the tree-type mismatch-shaping encoders. One or more number conservation rules may define outputs of the switching blocks based on the input of the switching blocks. A resolution of code B1 and code M1 may be $\log 2(33) \approx 5.05 \approx 5$ bits. In another embodiment, scrambler circuit 106-6 may be implemented as the scrambler circuit 116 (FIG. 23 of U.S. Pat. No. 6,348,884) is implemented as described in U.S. Pat. No. 6,348,884, which is also incorporated herein by reference. In another embodiment, code B1 may be encoded as 32 bits using thermometer-type encoding. Many variations of mismatch-shaping encoders (also known as dynamic-element-matching—or DEM—encoders and/or scrambler circuits) are known by a PHOSITA. Examples include swapping-type encoders, rotation-type encoders, dual-rotation-type encoders, tree-type encoders, count-and-sort-type encoders, etc. Mismatch-shaping encoders may be configured to provide zero-order encoding (for example, randomizing mismatch-induced errors), first-order encoding (for example, suppressing mismatch-induced errors by first-order filtering), or even higher-order encoding. Various types of encoders may be responsive to an optional random, pseudo-random, or substantially-random input (one or more bits, each bit may emulate a coin-flip stochastic event) that may be used to substantially suppress element-selection patterns that may be a cause for idle tones.

A combination of an input voltage VIN(t) and an analog dither value may be sampled on a CDAC capacitor array 102 of ADC 100. In particular, Pat. No. '443 is incorporated herein by reference to describe, in part, how a combination of an input voltage VIN(t) and an analog dither value may be sampled on a CDAC capacitor array 102 of ADC 100. For example, an analog input voltage VIN(t) may be applied to the capacitors of the first segment 102-1 and a substantially random analog dither value may be applied via code DX to the capacitors of the second segment 102-2, where the analog input voltage VIN(t) and substantially random analog dither value form a sampled value representing the combination. Accordingly, the CDAC 102 may sample the combination of the analog input voltage VIN(t) and the analog dither value. An operation/configuration of the third CDAC segment 102-3 may be predefined and fixed for all conversion cycles. For example, during acquisition phases, capacitors 102-3 may be connected in a predefined configuration (for example, all may be connected to VL). It may be a matter of personal preference whether or not the third segment 102-3 is to be considered a part of a CDAC structure. The third segment 102-3 may be not used to digital-to-analog (D/A) convert any part of code B, code DX, or any other numerical value or code that may change from one conversion cycle to the next.

Figure 2:
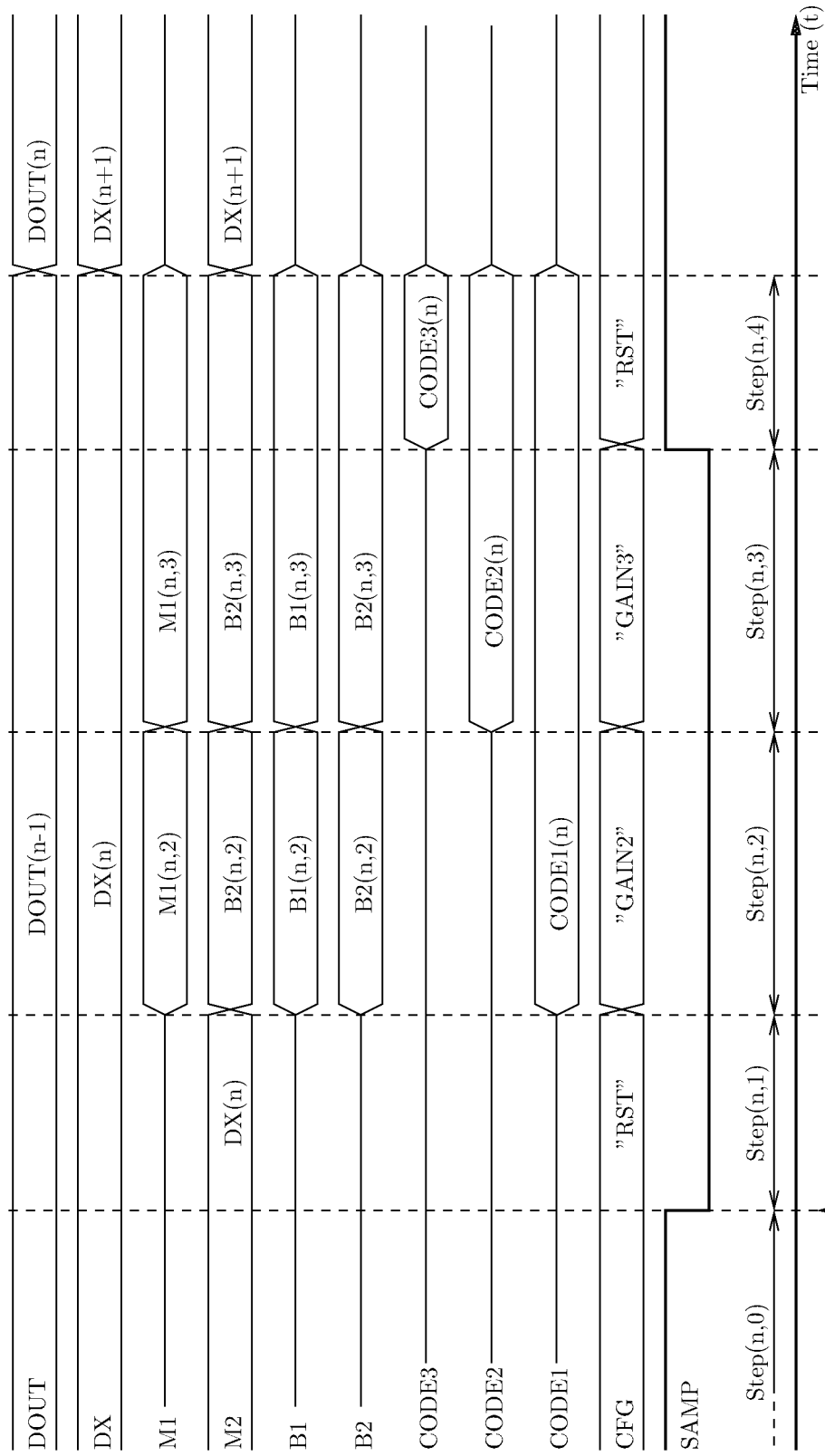
FIG. 2 shows an example timing sequence for ADC 100 in FIG. 1 according to various embodiments.

Control circuit 101 may derive a digital output code DOUT in relatively few steps of successive approximation compared to control circuit 206 of FIG. 2 in Pat. No. '443. For example, the control circuit 101 may derive a digital output code DOUT in relatively few steps of successive approximation compared to legacy control circuits implemented in conventional successive-approximation-register (SAR) ADCs. Specifically, control circuit 101 may be configured to derive a high-resolution code DOUT (for example, a resolution may be 16 bits, or more) in only 3 conversion steps and a code B may be derived in only 2 conversion steps. A conversion step may be a step of successive approximation, which may resolve one or a plurality of bits. The term "successive approximation" may be used herein to characterize circuits and/or methods that may resolve one or more bits per step of a conversion operation. For example, a successive-approximation conversion method may be by implemented by an ADC 200 described in Pat. No. '905 (FIG. 4).

In Pat. No. '905, ADC 200 (FIG. 4 of Pat. No. '905) may derive a conversion result d(k) as a weighted sum of 3 codes, such as for example d(k)=d1(k)+d2(k)/4+d3(k)/16, see cols. 7 and 8 of Pat. No. '905. FIGS. 4 and 5 of Pat. No. '905 show that the 3 codes may be derived sequentially by a quantizer 214 (FIG. 4 of Pat. No. '905) and they may be applied successively to a CDAC circuit via distinct segments thereof. A residue at a given conversion step (such as, a step wherein only d1(k) is known) may be amplified by an amplifier 218 (FIG. 4 of Pat. No. '905) configured with negative feedback to derive a next code, such as d2(k). A weighting factor may be included in a numerical value of each of the codes, and the conversion result may be expressed as d(k)=CODE1+CODE2+CODE3, where CODE1 may be d1(k) and CODE2 may be d2(k)/4 and CODE3 may be d3(k)/16. Col. 7 of Pat. No. '905 describes a benefit of using redundancy (also known as overlap or overrange) to provide a measure of robustness to several types of analog imperfections. In one example, CODE1, CODE2, and CODE3 may be 3-bit binary-weighted codes with a position offset of 2 bits (in other words, relative scaling by a factor of 4). Accordingly, CODE1, CODE2, and CODE3 need not correspond to distinct groups of bits of a binary-weighted representation of d(k)=CODE1+CODE2+ CODE3. A conventional digital adder circuit providing a carry-over from a bit position to a next bit position may be used to add CODE1, CODE2, and CODE3 to derive a binary-weighted code to represent a conversion result d(k). A nominally equivalent analog addition operation may be provided by applying the 3 codes to distinct segments of a CDAC structure (see FIG. 4 in Pat. No. '905). ADC 100 of FIG. 1 herein may have several aspects in common with ADC 200 of Pat. No. '905. The ADC 100 may derive a conversion result of a successive-approximation conversion method as a weighted sum of a plurality of codes. For example, the ADC 100 may derive a conversion result as a weighted sum of CODE1, CODE2, and CODE 3. The ADC 100 may combine CODE1 and CODE2 digitally/numerically before a combined value B=CODE1+CODE2 may be applied to the CDAC, which differs from the ADC 200 of Pat. No. '905. This may improve a linearity of ADC 100 as compared to legacy ADCs (including the ADC 200 of Pat. No. '905) if a matching of capacitors in CDAC capacitor array 102 is not perfect. In other words, it may improve a robustness of ADC 100 linearity with respect to potential capacitor mismatch errors as compared to the robustness of the linearity with respect to potential capacitor mismatch errors presented by the ADC 200 of Pat. No. '905. The ADC 100 may sequentially derive the codes (in particular, CODE1, CODE2, and CODE3) via a quantizer circuit (such as the quantizer circuit ADC 114-1 or the quantizer circuit ADC2 114-2), and several combinations of the codes (such as CODE1 and CODE1+CODE2) may be applied successively to the CDAC capacitor array 102. A residue at a conversion step may be amplified by an amplifier circuit (such as the amplifier circuit 118) having negative feedback for derivation of a next code. A weighting factor may be included in a numerical value of each of the codes, and the conversion result may be expressed as DOUT=CODE1+ CODE2+CODE3. In an example, CODE1, CODE2, and CODE3 may be 6-bit binary-weighted codes with a position offset of 5 bits (in other words, relative scaling by a factor of 32), and a resolution of DOUT may be 16 bits. Accordingly, ADC 100 may incorporate redundancy and CODE1, CODE2, and CODE3 need not correspond to distinct groups of bits of a binary-weighted representation of DOUT=CODE1+CODE2+CODE3. In an example, a most-significant bit (MSB) of CODE2 may overlap a least significant bit (LSB) of CODE1 corresponding to a degree of system-level redundancy. However, after a numerical addition operation B=CODE1+CODE2, an MSB of second segment B2 may not overlap an LSB of first segment B1, where B=B1+B2=CODE1+CODE2. An improved degree of linearity may result from resolving an overlap between CODE1 and CODE2 in the digital domain (by numerically calculating CODE1+CODE2) rather than in the analog domain (which may be done by applying CODE1 to an A-segment of a CDAC and CODE2 to a B-segment of a CDAC, separate from the A-segment).

FIG. 2 shows an example timing sequence for ADC 100 in FIG. 1. An input voltage VIN(n) in combination with an analog dither value derived from a dither code DX(n) may be sampled at a sampling instant. A reference to a value or code may include an index of a conversion cycle as a first argument. For example, DX(n) may refer to a state or a value of DX for an n'th conversion cycle. DOUT(n) shown in the upper right-hand corner of FIG. 2 may be an output code representing an input voltage VIN(n) sampled at a sampling instant shown in the lower left-hand corner of FIG. 2. A delay from a sampling instant for VIN(n) to providing a corresponding digital value DOUT(n) may be a latency of ADC 100. The sampling instant may be followed by a sequence of 3 conversion steps to sequentially derive 3 conversion codes: CODE1(n), CODE2(n), and CODE3(n).

The 3 conversion steps may be referred to as Step1, Step2, and Step3. An acquisition phase may be referred to as Step0. A reference to a value, code, or step may include an index for a step as a second argument. For example, Step(n,3) may refer to Step3 of an n'th conversion cycle. Another example, B2(n,2) may refer to a state or a value of code B2 at Step(n,2), in other words code B2 at Step2 of conversion cycle n.

A full conversion cycle for ADC 100 (including acquisition and digital processing) may be a sequence of 5 steps. Step0 may be an acquisition phase or step. Step1, Step2, and Step3 may be conversion steps or steps of a successive-approximation method. Step4 may be a final step for digital processing deriving a result DOUT. An overview of the 5 steps in accordance with some embodiments will be provided before describing each step in more detail.

Step0: acquire and sample a combined value comprising an analog input value VIN(n) and a dither value.

Step1: derive a code CODE1 to represent the sampled combined value.

Step2: derive a code CODE2 to represent a residue of the sampled combined value with respect to CODE1.

Step3: derive a code CODE3 to represent a residue of the sampled combined value with respect to CODE1+CODE2.

Step4: derive a code DOUT(n) to represent the analog input value VIN(n) by combining codes from steps 0, 1, 2, 3 with optional mismatch information.

Step0 is described in detail in Pat. No. '443. A summary/overview will be provided here (refer to FIG. 1 and FIG. 2). During an acquisition phase, an input voltage VIN(t) may be applied across one, several, or all N1 capacitors in a first segment of capacitors 102-1. An analog dither value may be applied by D/A converting a dither code DX(n) via a second segment of capacitors 102-2. A third segment of capacitors 102-3 may be configured in a predefined fixed "reset" state, which may be selected in part to provide a nominal offset (for example, zero). The switch 108 may couple a connection of the first segment of capacitors 102-1, a connection of the second segment of capacitors 102-2, and a connection of the third segment of capacitors 102-3 to a predefined potential (such as ground) during the acquisition phase, where the connection coupled to the predefined potential is distinct from connections where the input voltage VIN(t), the analog dither value, and the predefined fixed "reset" state are applied. A combination of the values applied to CDAC capacitor array 102 (a combined value) may be sampled and represented by a substantially isolated charge quantity on node 104 when sampling switch 108 is opened at a sampling instant for VIN(n). A charge portion of the first segment of capacitors 102-1, the second segment of capacitors 102-2, and the third segment of capacitors 102-3 may be substantially isolated on node 104 when the sampling switch 108 is opened at the sampling instance. In preparation of Step1, a nominally equivalent combined value may be sampled by a first quantizer circuit ADC1 114-1 at or about the sampling instant. ADC1 114-1 may be configured to receive input voltage VIN(t) and dither code DX(n). In an embodiment, the dither code DX(n) provided to ADC1 114-1 may be truncated to a coarser resolution than dither code DX(n) provided to CDAC capacitor array 102 via multiplexer circuit 106-3.

Now consider Step1 (derive a code CODE1 to represent the sampled combined value). Quantizer circuit ADC1 114-1 may be any type of quantizer/ADC circuit configured to provide a CODE1 to represent a sampled combined value that is nominally equivalent to the combined value sampled on CDAC capacitor array 102 at the sampling instant for VIN(n). A nominal value may be CODE1(n)=VIN(n)/VSCALE+DX(n)+OFFSET1, where VSCALE may be a scaling factor and OFFSET1 may be a constant value. A resolution of CODE1 may be selected based on a degree of mismatch that may be expected for the combined value sampled by ADC1 114-1 compared to the combined value sampled by CDAC 102. In an example embodiment, an estimated worst-case mismatch error may be 1 percent of a full scale, and a resolution of CODE1 may be selected to be 8 bits. At 8-bit resolution, ADC1 114-1 may be a flash quantizer, a two-step quantizer, a successive-approximation-register (SAR) ADC, a voltage-controlled oscillator (VCO)-based quantizer, a pipeline ADC, or any other type of quantizer that may be deemed suitable for an application. A small circuit size, low power, and fast operation may be desired properties for ADC 114-1. In an example embodiment that may target a low power consumption, ADC1 114-1 may be a SAR ADC comprising a CDAC capacitor array that is significantly smaller than CDAC capacitor array 102. In these embodiments for example, the total capacitance of the ADC1 114-1, implemented as a SAR ADC, may be less than 10 percent of the total capacitance of the CDAC capacitor array 102. For example, a SAR ADC1 114-1 may comprise a CDAC capacitor array having a total capacitance of less than 1 pF. The right-hand side of the first segment of capacitors 102-1 may be floating during Step1 (in other words, all switches 110-1 may be open). The second and third segments of CDAC capacitor array 102 may remain configured as they were during Step0. In another embodiment, ADC1 114-1 may be configured to sample VIN(t) and derive a code that is combined numerically with dither code DX(n) to provide CODE1. Accordingly, ADC1 114-1 need not (but may) include dither in an analog quantity sampled by ADC1 114-1 to derive CODE1 to approximately represent the combined value sampled on CDAC capacitor array 102.

Now consider Step2 (derive a code CODE2 to represent a residue of the sampled combined value with respect to CODE1). An amplifier circuit 118 may be configured with negative feedback provided by the third segment of capacitors 102-3 via switches 110-3. A factor of gain GAIN2 (in other words, an amount of negative feedback) may be selected in part based on how good an approximation CODE1 can be expected (relied on) to be with respect to the combined value sampled on the CDAC capacitor array 102. A factor of gain GAIN2 may be selected to provide redundancy with respect to a resolution and accuracy of CODE1. A relatively inaccurate value of CODE1 in combination with a large factor of gain GAIN2 may cause amplifier 118 to saturate during Step2. A relatively smaller factor of gain GAIN2 may be selected to prevent saturation. In an example embodiment wherein a resolution of CODE1 may be 8 bits, a factor of gain may be GAIN2=64.

Control circuit 101 may be configured to receive CODE1 from ADC1 114-1 and apply it to CDAC capacitor array 102 via a first segment B1 of code B and a second segment B2 of B. The codes may represent numerical values for which CODE1(n)=B(n,2)=B1(n,2)+B2(n,2). Accordingly, a value corresponding to CODE1 may be applied to CDAC capacitor array 102 via code segments B1 and B2 of B. In an example embodiment, a resolution of CODE1 may be less-than-or-equal-to a resolution of code segment B1. In that case, an assignment of CODE1 may be B1(n,2)=CODE1(n) and B2(n,2)=0. However, in another example embodiment, an 8-bit resolution of CODE1 may exceed a resolution of code segment B1. First capacitor segment 102-1 may comprise N1=32 capacitors, and code segment B1 may be encoded using 6 physical bits with 6 corresponding weights 16/32, 8/32, 4/32, 2/32, 1/32, and 1/32. A resolution of code segment B1 may be (approximately) 5 bits. It may be advantageous to implement ADC1 114-1 to provide CODE1 in a format similar to that of code B. For example, ADC1 114-1 may be a SAR ADC comprising a CDAC with nominal weights 16/32, 8/32, 4/32, 2/32, 1/32, 1/32, 1/64, 1/128, 1/256. CODE1 may be encoded by 9 physical bits and a resolution of CODE1 may be (approximately) 8 bits. A first group of 6 physical bits of CODE1 with weights 16/32, 8/32, 4/32, 2/32, 1/32, 1/32 may be assigned to code B1(n,2). A second group of 3 physical bits of CODE1 with weights 1/64, 1/128, 1/256 may be assigned to code B2(n,2). Code B2 may be a binary-weighted code with N2=15 physical bits having weights 1/64, 1/128, 1/256, 1/512, 1/1024, . . . , 1/1048576. In an example embodiment, control circuit 101 may not need to perform any non-trivial computations to provide code segment B1 and code segment B2 to represent CODE1 in Step2. In another example embodiment, control circuit 101 may be configured to derive code segment B1 and code segment B2 as non-trivial functions of CODE1. For example, B=B1+B2 may be scaled linearly with respect to CODE1. A slope and/or an offset of a linear scaling may be determined as a part of a manufacturing process, for example as a part of testing a semiconductor circuit.

A multiplexer circuit 106-3 may be configured to provide M2(n,2)=B2(n,2) to the second segment 102-2 of the CDAC. A scrambler circuit 106-6 may receive B1(n,2) and encode it to a representation M1(n,2) comprising N1=32 physical bits. Each bit may have a weight 1/32 and a value of B1(n,2) may be preserved, in other words M1(n,2)=B1(n,2). Code M1(n,2) may control switches 110-1 to selectively apply a reference potential (VH or VL) to each capacitor in the first segment of capacitors 102-1. A first code CODE1(n)=B1(n,2)+B2(n,2)=M1(n,2)+M2(n,2) may be approximating a combination of an analog input value VIN(n) and a dither value sampled on a node 104 of the capacitor array 102 in Step0. A first segment M1(n,2) of the first code may be applied to a first segment 102-1 of the capacitor array 102. A second segment M2(n,2) of the first code may be applied to a second segment 102-2 of the capacitor array 102.

Any capacitor in the third segment of capacitors 102-3 that is not configured to provide negative feedback for amplifier 118 may be configured in a predefined state (such as, connected to VL) during Step2. An output of amplifier 118 may substantially settle to a voltage that may be an amplified residue of the sampled combined value with respect to CODE1. A factor of amplification may be a negative value (such as −64), but a polarity may be reasonably ignored in this description (for example, GAIN2=absolute(−64)=64). A second quantizer circuit ADC2 114-2 may be configured to receive the amplified residue voltage and provide a code CODE2(n) to represent the residue. In one example embodiment, various parameters for ADC 100 (including, but not limited to, parameters for ADC2 114-2) may be selected such that a nominal value for CODE2(n) may be CODE2(n)=VIN(n)/VSCALE+DX(n)−CODE1(n)+OFFSET2, where VSCALE may be a scaling factor and OFFSET2 may be a constant value. In some embodiments, CODE2(n) may further include a second scaling factor SCALE2, such that CODE2(n)=(VIN(n)/VSCALE+DX(n)−CODE1(n))/SCALE2+OFFSET2, where SCALE2 may be responsive to a value of GAIN2 and a scaling factor of the second quantizer circuit 114-2. A factor of gain GAIN2 may be included or cancelled in weight factors for each physical bit representing CODE2(n). A resolution of CODE2 may be selected based on a precision that may be expected (relied upon) of amplifier circuit 118 including negative feedback and quantizer circuit ADC2 114-2. ADC2 114-2 may be a flash quantizer, a two-step quantizer, a SAR ADC, a VCO-based quantizer, a pipeline ADC, or any other type of quantizer that may be deemed suitable for an application. A small circuit size, low power, and fast operation may be desired properties for ADC2 114-2. In an example embodiment, ADC2 114-2 may be a SAR ADC comprising a CDAC capacitor array that is significantly smaller than CDAC capacitor array 102. For example, a SAR ADC2 114-2 may comprise a CDAC capacitor array having a total capacitance of less than 1 pF, where the CDAC capacitor array 102 may have a total capacitance greater than 1 pF (such as 40 pF). A resolution of CODE2 may be (approximately) 10 bits. CODE2 may be represented by more than 10 physical bits, and bit weights may be based on features of ADC2 providing redundancy (for example, a nominal scaling of a CDAC capacitor array). For example, CODE2 may be represented by 12 physical bits having weights 1/128, 1/256, 1/512, 1/1024, 1/2048, 1/2048, 1/4096, 1/8192, 1/16384, 1/16384, 1/32768, 1/65536. The first quantizer ADC1 114-1 may be configured to provide an offset in CODE1(n) to set a wanted mean value for CODE2(n) and/or a wanted mean value for the amplified residue voltage. A mean value of CODE2(n) may be near a middle of a range of possible values, such as approximately 1/128. A range of possible values for CODE2 may be unipolar. In another example embodiment, a range of possible values for CODE2 may be bipolar, and a nominal mean value of CODE2(n) may be approximately 0.

If CODE1(n) has a set of desired properties, for example, CODE1(n)≈VIN(n)/VSCALE+DX(n)+OFFSET1, then CODE2(n) may be an outcome of a substantially stochastic process when DX(n) is derived from a substantially stochastic process. For example, DX(n) may be provided by a circuit generating substantially-random values comprised in control circuit 101. Specifically, if evaluated as a signal, CODE2(n) may be substantially a noise-like signal and it may be substantially not correlated with VIN(n). However, if ADC1 114-1 is subject to an analog imperfection (for example, a gain error), then CODE2(n) and VIN(n) may be somewhat correlated. Teachings of Pat. No. '443 (col. 12 lines 20-36) include that, in some embodiments, to improve linearity, it may be an objective to reduce correlation of VIN(n) with any bit sequence controlling a capacitor in the second capacitor segment 102-2 in Step(n,3). Accordingly, it may be an objective to reduce (ideally avoid) correlation of VIN(n) and M2(n,3), including correlation of VIN(n) with any individual physical bit of M2(n,3). Teachings of Pat. No. '443 may also include a refined objective described in col. 14 lines 28-49. A linearity of ADC 100 may be improved by combining CODE1 and CODE2 digitally/numerically (in other words, in a digital domain) in Step3 rather than by combining them in an analog domain (for example, via distinct segments of a CDAC capacitor array as shown for ADC 200 in FIG. 4 of Pat. No. '905).

CODE2(n) may be a second code representing a residue of the combination of the analog input value VIN(n) and the dither value sampled on node 104 of capacitor array 102 with respect to the first code CODE1(n)=M1(n,2)+M2(n,2) applied to the capacitor array 102.

Now consider Step3 (derive a code CODE3 to represent a residue of the sampled combined value with respect to CODE1+CODE2). CODE1 and CODE2 may be combined digitally/numerically and a combined value B=CODE1+CODE2 may be applied to the CDAC capacitor array 102 via a first segment B1 and a second segment B2 of B. For example, the control circuit 101 may digitally/numerically combine CODE1 and CODE 2 to produce combined value B, and apply the combined value B to the CDAC capacitor array 102 via a first segment B1 and a second segment B2 of the combined value B. The first segment B1 of B may be encoded by a scrambler circuit 106-6. The second segment B2 of B may have a range of possible values that may be substantially as wide as a smallest weight factor (such as a least significant bit, LSB) of B1. Second segment B2 of B may not need to provide redundancy, and that may be beneficial for a linearity of ADC 100.

Control circuit 101 may be configured to calculate B(n, 3)=CODE1(n)+CODE2(n). A binary-weighted representation of the second segment B2(n,3) of B(n,3) may be derived without ambiguity by selecting a group of bits from a binary-weighted representation of B(n,3). However, it may be possible to encode a numerical value of B1(n,3)=B(n, 3)−B2(n,3) in a plurality of ways, because a physical format for encoding B1(n,3) may provide a degree of redundancy. Properties of scrambler circuit 106-6 may determine if a specific type of coding of B1 may be preferred in another embodiment. In one embodiment, all types of encoding of B1 may be equivalent if scrambler circuit 106-6 is configured to derive a thermometer code from B1, see for example U.S. Pat. No. 6,348,884. Column 22 of Pat. No. '443 describe several options for scrambler circuit 106-6, including one where B1 may be encoded somewhat arbitrarily. The scrambler circuit 106-6 may comprise a rotary scrambler, a butterfly scrambler, a tree scrambler, or any other type of scrambler known to a PHOSITA. In some embodiments, the scrambler circuit 106-6 may implement an encoding function, where a number of input terminals of the scrambler circuit 106-6 may be different than a number of output terminals of the scrambler circuit 106-6. A non-redundant (for example, binary-weighted) encoding of B2(n,3) may be beneficial for making an approximation, such as described in Pat. No. '443 (col. 13, lines 10-15), relatively good for all physical bits of M2(n,3). That may be beneficial for improving a linearity of ADC 100. FIG. 2 shows that a value of B1 may change from a value B1(n,2) in Step2 to another value B1(n,3) in Step3. Accordingly, a code M1 provided by scrambler circuit 106-6 may change from a value M1(n,2) in Step2 to another value M1(n,3) in Step3. In some conversion cycles, the codes may not change from Step2 to Step3 (for example, for some values of n, B1(n,2)=B1(n,3)). In one embodiment, a range of possible values of CODE2(n) may be unipolar, and/or a change in value, B1(n,3)−B1(n,2), may correspond to at most one bit of M1 changing value. That may be beneficial to reduce switching of CDAC capacitors 102-1 and loading of reference circuit 107.

A residue of the combined value sampled on CDAC capacitor array 102 with respect to B(n,3) applied to the CDAC in Step3 may be relatively small and substantially not correlated with VIN(n). In an example embodiment, various parameters for ADC 100 (including, but not limited to, parameters for ADC2 114-2) may be selected such that a nominal value of a CODE3(n) representing the residue may be CODE3(n)=VIN(n)/VSCALE+DX(n)−B(n,3)+OFFSET3, where VSCALE may be a scaling factor and OFFSET3 may be a constant value. The expression reflects that an error (for example, a mismatch of a value sampled by ADC1 114-1) comprised in CODE1(n) may be compensated for by CODE2(n) when B(n,3)=CODE1(n)+CODE2(n).

CODE1(n)=M1(n,2)+M2(n,2) may be combined with CODE2(n) to derive a combined code B(n,3)=M1(n,3)+M2(n,3). A first segment M1(n,3) of the combined code may be applied to a first segment 102-1 of the capacitor array 102. A second segment M2(n,3) of the combined code may be applied to a second segment 102-2 of the capacitor array 102. Both segments M1(n,3) and M2(n,3) may be responsive to the second code CODE2(n).

An operation of ADC 100 in Step1 to derive CODE1(n) may be relatively less important than operations during Step2 and Step3. An operation of ADC 100 in Step2 to derive CODE2(n) may substantially determine properties of the residue to be represented by CODE3(n) in Step3. The residue may be substantially not correlated with VIN(n), and an error comprised in CODE3(n) may be relatively unimportant for a linearity of ADC 100. An operation of ADC 100 in Step3 to derive CODE3(n) may affect noise and offset specifications of ADC100.

In Step3, amplifier circuit 118 may be configured with negative feedback provided by the third segment of capacitors 102-3. A factor of gain GAIN3 may be selected in part based on an expected worst-case (largest) magnitude of the residue to be represented by CODE3(n). In some embodiments, the factor of gain GAIN3 may have an absolute value of at least 250. In an example embodiment, a resolution of B(n,3)=CODE1(n)+CODE2(n) may be (approximately) 16-bit, and capacitors 102-3 may be configured for amplifier circuit 118 to provide a factor of gain GAIN3=2048.

An output of amplifier circuit 118 may substantially settle to a voltage that may be an amplified residue of the sampled combined value with respect to B(n,3)=CODE1(n)+CODE2(n). The second quantizer circuit ADC2 114-2 may be configured to sample the amplified residue voltage and to provide a code CODE3(n) representing the residue. Gain factor GAIN3 may be included or cancelled in weights for each physical bit representing CODE3(n). A resolution of CODE3(n) may be equal to a resolution of CODE2(n), which may be (approximately) 10 bits. CODE3(n) may be represented by more than 10 physical bits, and bit weights may be based on features of ADC2 114-2 providing redundancy (for example, a nominal scaling of a CDAC capacitor array). For example, CODE3 may be represented by 12 physical bits having weights 1/4096, 1/8192, 1/16384, 1/32768, 1/65536, 1/65536, 1/131072, 1/262144, 1/524288, 1/524288, 1/1048576, 1/2097152.

CODE3(n) may be a third code representing a residue of the combination of the analog input value VIN(n) and the dither value sampled on node 104 of capacitor array 102 with respect to the combined code B(n,3)=M1(n,3)+M2(n,3) applied to capacitor array 102.

In an example embodiment, various parameters for ADC 100 may be selected such that a nominal value of DOUT(n) may be (VIN(n)/VSCALE)=CODE1(n)+CODE2(n)+CODE3(n)−DX(n). A resolution of the value DOUT(n) may be (approximately) 21 bits. A resolution may be relatively less (for example, 20 bits), in another embodiment, if GAIN3 is relatively reduced (for example, from 2048 to 1024). A large factor of gain GAIN3 may be beneficial to suppress a noise contribution from ADC2 114-2 via CODE3 (n). A resolution of ADC2 114-2 (such as, a resolution of CODE2 and/or CODE3) and a factor of gain GAIN3 may be selected based on a target noise specification for ADC 100. It may be advantageous to select parameters for ADC 100 such that a noise level and/or a resolution of ADC2 has relatively little impact on a noise specification of ADC 100.

Any capacitor in the third segment of capacitors 102-3 that is not configured to provide negative feedback for amplifier 118 in Step3 may be configured in a predefined state (for example, connected to VL).

PHOSITA will recognize that amplifier 118 may include auto-zeroing circuitry (not shown) and/or other circuitry and methods to improve an offset specification of ADC 100.

PHOSITA will further recognize that amplifier 118 may be in a low-power mode (for example, it may be turned off) once ADC2 has sampled an amplified residue voltage needed to derive CODE3(n).

PHOSITA will further recognize that ADC2 114-2 may be configured to provide a CODE2 of a first resolution in Step2 (such as 8 bits) and to provide a CODE3 of a second resolution in Step3 (such as 10 bits). Alternatively, a third quantizer circuit ADC3 (not shown) may be provided and configured to provide CODE3 in Step3, and ADC2 114-2 may be configured to provide CODE2 in Step2 (and be inactive in Step3). In another embodiment, a single quantizer circuit may be configured to operate as ADC1 114-1 in Step1, and it may be further configured to operate as ADC2 114-2 in Step2 and Step3.

Now consider Step4 (derive a code DOUT to represent the analog input value VIN(n) by combining codes from steps 0, 1, 2, 3 with optional mismatch information). Mismatch information may include a plurality of codes representing potential mismatch of capacitor ratios and/or other analog imperfections. In an example embodiment, control circuit 101 may be configured to calculate DOUT(n)=CODE1(n)+CODE2(n)+CODE3(n)−DX(n). Potential mismatch of capacitor ratios for CDAC capacitor array 102 may be not accounted for and mismatch of capacitors 102 may induce a noise-like error (mismatch-induced noise) in DOUT(n). A linearity of ADC 100 may be substantially not affected by potential mismatch of CDAC capacitor array 102. A reason for including mismatch information when calculating DOUT may be to improve a signal-to-noise ratio (SNR) by reducing mismatch-induced noise (for example, to below a level characterized by thermal noise).

The scrambler circuit 106-6 and dither codes DX(n) may be provided and configured so that a power spectral density of any mismatch-induced noise may be substantially uniform, as described further in regard to the scrambler circuit 206-6 of Pat. No. '443 and, in particular, in FIG. 10b of Pat. No. '443. Specifically, in an example embodiment, scrambler circuit 106-6 may be implemented as summarized in Pat. No. '443 in col. 11, lines 54-62. For example, the scrambler circuit 106-6 may be implemented as a zero-order mismatch-shaping encoder, which may nominally randomize errors induced by mismatch of the first segment of capacitors 102-1 into a substantially white-noise-like error signal. Dither codes DX(n) may be provided by control circuit 101 as N2 substantially independent coin-toss bit sequences (Pat. No. '443, including col. 12, lines 49-57). Control circuit 101 may comprise a pseudo-random-number generator to derive DX(n), or it may comprise other circuitry (comparable to Pat. No. '443) to provide bit sequences that are relatively more/better random (for example, substantially random sequences that do not repeat). Truly random bit sequences may be used, but truly random dither may be not needed to achieve the objectives of this teaching. It may be sufficient that DX(n) is at least random-like, which is a relatively low standard that may be met by a pseudo-random-number generator. For example, the dither codes DX(n) may comprise a plurality of pseudo-random bits, where the plurality of pseudo-random bits may be produced by a pseudo-random-number generator, such as a linear-feedback-shift-register (LFSR) generator or one based on cellular automata. Substantially random sequences that do not repeat may be preferred for some embodiments.

Pat. No. '443 further teaches a scrambler circuit that may be provided as the scrambler circuit 106-6 in another embodiment. In particular, Pat. No. '443 teaches that a scrambler circuit 206-6 (FIG. 7 of Pat. No. '443) and dither codes DX(n) may be provided so that a power spectral density of any mismatch-induced noise may be substantially non-uniform/shaped (FIG. 10c in Pat. No. '443). Specifically, scrambler circuit 206-6 (FIG. 7 of Pat. No. '443) may be a first-or-higher-order mismatch-shaping encoder. (Pat. No. '443, col 11, line 62 onwards) Furthermore, as described by the applicant in earlier patent disclosures, to achieve first-or-higher order shaping (regulation) of errors induced by mismatch of capacitors 102-2, dither codes DX(n) may be derived by a state machine receiving as inputs DX(n−1), B2(n−1,3) and optionally also one or more substantially random bits to reduce potential patterns (for example, idle tones) that may be embedded in the mismatch-induced errors. The state machine may be configured to effectively regulate spectral properties of each individual bit in M2 driving capacitors 102-2.

In an embodiment, mismatch information (for example, codes representing potential mismatch of capacitor ratios and/or other analog imperfections) may be provided to control circuit 101, which may be configured to include the mismatch information when deriving DOUT(n). Mismatch information may be derived as a part of a manufacturing process, for example, as a part of testing a semiconductor circuit. Alternatively, mismatch information may be derived in the field during normal operation of ADC 100, either by foreground calibration (for example, during power up, idle periods, or interruptions) or by background calibration (for example, using a statistical method). U.S. Pat. No. 7,705,765 to Yang describes how weighting factors of a CDAC may be measured, and how digital codes representing measured weighting factors may be stored and combined with a digital code from a A/D conversion operation to derive an encoded numerical value representing an analog signal value. U.S. Pat. No. 7,705,765 is incorporated herein by reference.

A nominal value DOUT(n)=M1(n,3)+[M2(n,3)−DX(n)]+CODE3(n) may be a combination of a third code CODE3(n), a combined code M(n,3)=M1(n,3)+M2(n,3), and a dither code DX(n) representing the dither value sampled in Step0.

Mismatch information may be included in a calculation of DOUT(n) to account for a potential deviation of nominal weight factors, where estimated (corrected, based on the mismatch information) weight factors may be applied to each individual bit in the calculation of the DOUT(n), such as described in Pat. No. '443 (in particular, col. 8, lines 16-29). A calculation may be based on an acquisition state of the CDAC (Step0, dither code DX(n)) and an evaluation state of the CDAC (Step3, codes M1(n,3), M2(n,3) and CODE3(n)). Note that bits y1, y2, y3, y4 in Pat. No. '443 may be bits representing M1(n,3); that bits y5, y6, y7, y8, y9, y10 in Pat. No. '443 may be bits representing M2(n,3), and that bits x5, x6, x7, x8, x9, x10 in Pat. No. '443 may be bits representing DX(n). Further note that DOUT=y1*w(T1)+y2*w(T2)+y3*w(T3)+y4*w(T4)+(y5−x5)*w(T5)+(y6−x6)*w(T6)+(y7−x7)*w(T7)+(y8−x8)*w(T8)+(y9−x9)*w(T9)+(y10−x10)*w(T10) from Pat. No. '443 col. 8, lines 24-26 may be a bit-wise calculation of DOUT(n)=M1(n,3)+[M2(n,3)−DX(n)]+CODE3(n) corresponding to estimated weights w(T1), w(T2), w(T3), w(T4) of each bit in M1(n,3) and estimated weights w(T5), w(T6), w(T7), w(T8), w(T9), w(T10) of each bit in M2(n,3) and DX(n), where each bit is assigned an estimated (corrected) weight factor, which may be a nominal weight factor plus an adjustment/correction based on the mismatch information.

A nominal-weighted value M1(n,3) of a code M1(n,3) may be calculated by applying a nominal weight (for example, 1/4 for each bit in the first segment 201-1 of the CDAC 201 in FIG. 2 of Pat. No. '443) to each bit in the code. An estimate-weighted value EW_M1(n,3) of a code M1(n,3) may be calculated by applying an estimated weight to each bit in the code. Nominally, EW_M1(n,3)=M1(n,3). For example, a nominal-weighted value of M1(n,3) represented by bits [y1, y2, y3, y4] may be M1(n,3)=y1/4+y2/4+y3/4+y4/4 and an estimate-weighted value of M1(n,3) may be EW_M1(n,3)=y1*w(T1)+y2*w(T2)+y3*w(T3)+y4*w(T4), where w(T1), w(T2), w(T3), w(T4) may be estimates of the weight of each of the bits. Accordingly, the expression for DOUT (from Pat. No. '443 col. 8, lines 24-26) may be an estimate-weighted evaluation of a nominal calculation DOUT(n)=M1(n,3)+[M2(n,3)−DX(n)]+CODE3(n), where w(T1), w(T2), w(T3), w(T4), w(T5), w(T6), w(T7), w(T8), w(T9), w(T10) may be estimates of the weight of each bit applied to CDAC 201 in FIG. 2 of Pat. No. '443. In other words, the expression for DOUT (from Pat. No. '443 col. 8, lines 24-26) may be alternatively expressed as DOUT(n)=EW_M1(n,3)+[EW_M2(n,3)−EW_DX(n)]. As referred to in this paragraph T* may refer to an input terminal of the capacitors within the CDAC capacitor array 102, the * representing a number (index) assigned to each of the capacitors where the number is unique to each of the capacitors. w(T*) may be the weight (for example, an estimated weight) being applied to a bit in the code applied to terminal T*. For example, y* may represent a bit of M1(n,3), where the * is a number (index) designating a bit position within M1(n,3).

A value of a code may be assumed to be nominal-weighted, unless it is explicitly stated that it is an estimate-weighted value. A prefix "EW_" added to a code name CODENAME shall be an explicit reference to an estimate-weighted value EW_CODENAME of the code CODENAME.

In an embodiment, mismatch information (for example, codes representing potential mismatch of capacitor ratios and/or other analog imperfections) may provide an estimated weight for one or more bits in one or more of the codes M1(n,3), M2(n,3), DX(n), and CODE3(n) that may be combined to derive DOUT(n). Control circuit 101 may be configured to receive mismatch information and to derive and output a binary-weighted code DOUT(n)=EW_M1(n,3)+EW_M2(n,3)−EW_DX(n)+EW_CODE3(n). A nominal weight may be used for any bit of any code for which mismatch information does not provide an explicit estimate of an actual weight. In other words, a nominal weight may be a baseline (initial or default) estimate of a weight for any bit in any code.

In one embodiment, mismatch information may be provided and used to calculate an estimate-weighted value EW_M1(n,3) of a code M1(n,3) applied to the first segment 102-1 of CDAC capacitor array 102 at an evaluation state (such as, Step3). The mismatch information may provide an estimated weight for each bit in the code M1(n,3). Nominal-weighted values may be calculated for M2(n,3), DX(n), and CODE3(n), and the values may be combined to provide an output value DOUT(n) representing a sampled input value VIN(n). DOUT(n)=EW_M1(n,3)+M2(n,3)+CODE3(n)−DX(n).

In another embodiment, mismatch information may be provided and used to calculate estimate-weighted values EW_M1(n,3) and EW_M2(n,3) of codes M1(n,3) and M2(n,3), which may be applied to CDAC capacitor array 102 at an evaluation state (such as, Step3). Mismatch information may be also provided and used to calculate an estimate-weighted value EW_DX(n) of a code DX(n) applied to a second segment 102-2 of CDAC capacitor array 102 at an acquisition state (such as, Step0). A nominal-weighted value may be calculated for CODE3(n). The values may be combined to provide an output code DOUT(n) representing VIN(n). DOUT(n)=EW_M1(n,3)+EW_M2(n,3)−EW_DX(n)+CODE3(n). Estimated weights for bits of M2(n,3) and DX(n) may be shared, and EW_M2(n,3)−EW_DX(n) may be calculated using bit-value-differences, as described in Pat. No. '443.

In another embodiment, mismatch information may be provided and used to calculate an estimate-weighted value EW_CODE3(n) of CODE3(n). A single code may designate a ratio RATIO of an estimated weight and a nominal weight of each bit in CODE3(n), so that EW_CODE3(n)=RATIO*CODE3(n). Accordingly, mismatch information may be used to scale a nominal value CODE3(n) to derive an estimate-weighted value EW_CODE3(n) thereof. Mismatch information may be provided and used to calculate estimate-weighted values EW_M1(n,3), EW_M2(n,3), and EW_DX(n) of codes M1(n,3), M2(n,3), and DX(n). The values may be combined to provide an output value DOUT(n) representing a sampled input value VIN(n). DOUT(n)=EW_M1(n,3)+EW_M2(n,3)−EW_DX(n)+EW_CODE3(n).

In another embodiment, an estimate-weighted value may be calculated for one or more codes M1(n,3), M2(n,3), DX(n), and CODE3(n). In each case, an estimate-weighted value may be calculated as a sum of a nominal value and an adjustment (deviation) value. Mismatch information may be provided and used to calculate each adjustment (deviation) value.

In another embodiment, a scrambler circuit 106-6 and dither code DX(n) may be provided so that a power spectral density of any mismatch-induced noise may be substantially non-uniform/shaped (such as shown in FIG. 10c in Pat. No. '443). Control circuit 101 may be configured to receive and use mismatch information to calculate an estimate-weighted value of one or more codes M1(n,3), M2(n,3), DX(n), and CODE3(n) to derive an output code DOUT(n) representing a sampled input value VIN(n).

FIG. 2 shows a timing of a control signal SAMP that may control sampling switch 108 (FIG. 1). Sampling switch 108 may open at a sampling instance for VIN(n) at or near the end of an acquisition phase Step(n,0). Sampling switch 108 may remain open during 3 conversion steps: Step1, Step2, and Step 3. Sampling switch 108 may close after ADC2 114-2 samples an amplified residue voltage to derive CODE3(n). For example, switch 108 may close in a transition from Step3 to Step4, and switches 110-1 (FIG. 1) may be configured to apply VIN(t) across first capacitor segment 102-1 during Step4. Step(n,4) may overlap with an acquisition phase Step(n+1,0) of a next conversion cycle. In another embodiment, code DX may transition from DX(n) to DX(n+1) at or before sampling switch 108 closes. More generally, in another embodiment, ADC 100 except control circuit 101 may be reset at the end of Step3. Certain parts of ADC 100 (for example, ADC1 114-1) may be reset sooner. PHOSITA may recognize that the example timing sequence of FIG. 2 may be modified, and that FIG. 2 may be drawn to best convey the present teaching.

Figure 3:
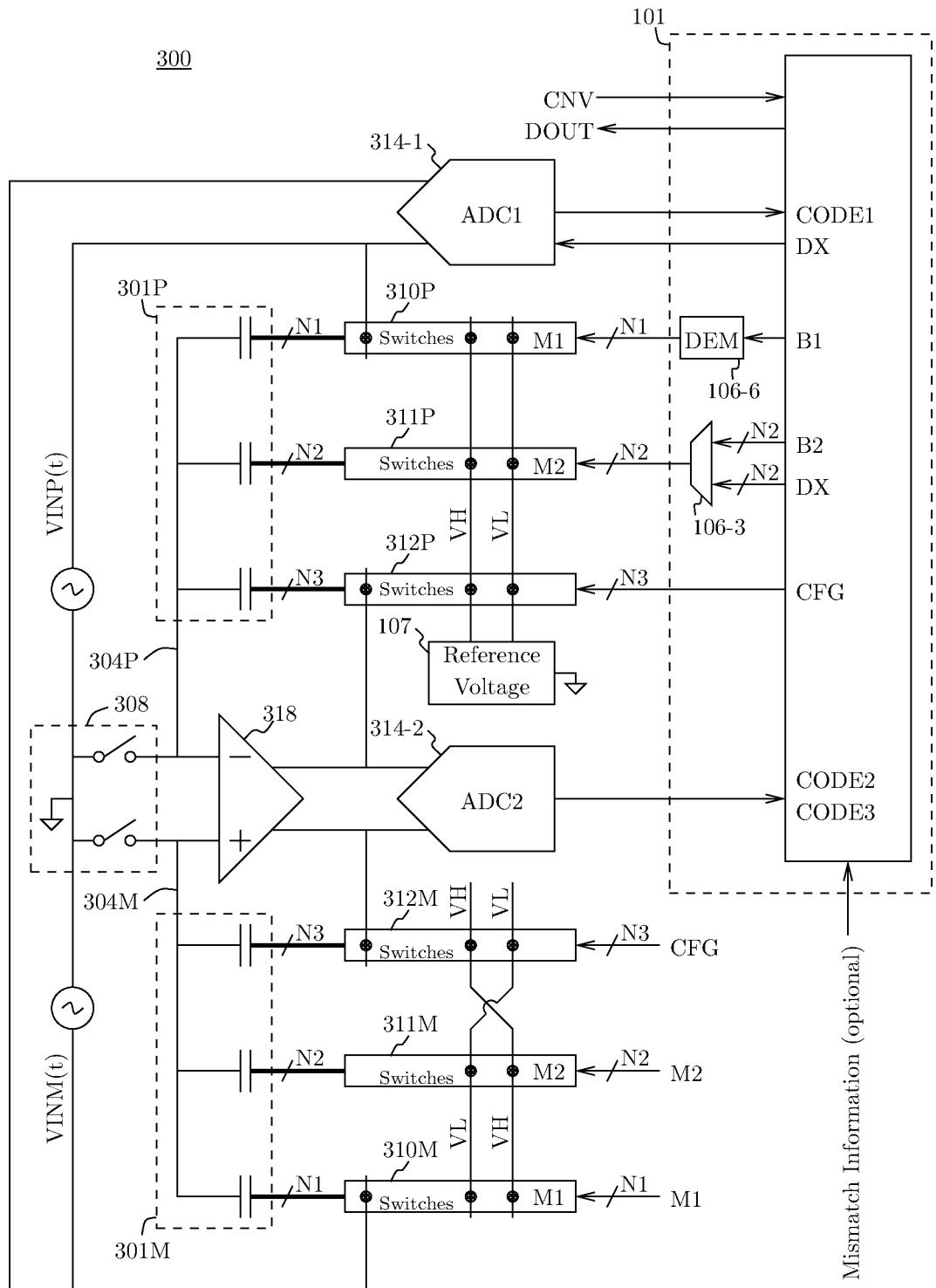
FIG. 3 shows an example fully differential implementation of an ADC similar to the ADC of FIG. 1 according to various embodiments.

Many variations of the present teaching are anticipated. For example, FIG. 3 shows an example fully differential implementation of an ADC 300 similar to the ADC 100 of FIG. 1. A fully differential input voltage VIN(t) may be a voltage difference between a positive potential VINP(t) and a negative potential VINM(t). A fully differential first quantizer ADC1 314-1 may be configured to receive the differential voltage VIN(t) and to provide a first code CODE1 to represent VIN(t) sampled at a sampling instant in combination with an analog dither value derived from a dither code DX. A CDAC may comprise a positive-side capacitor array 301P and a negative-side capacitor array 301M. Each capacitor array 301P and capacitor array 301M may comprise 3 segments and have an overall structure similar to capacitor array 102 of FIG. 1. A combination of VIN(t) sampled at a sampling instant and a dither value derived from dither code DX may be a differential charge quantity substantially isolated at node 304P and node 304M. A sampling switch 308 may be a symmetrical device connecting each node 304P and node 304M to a bias potential (such as, ground) during an acquisition phase. Inputs of a fully differential residue amplifier 318 may be connected to node 304P and node 304M, and it may output a differential voltage representing an amplified residue. A fully differential second quantizer ADC2 314-2 may receive an amplified residue from amplifier 318 and provide a code CODE2 to represent a residue of the combined sampled value with respect to CODE1, and further provide a code CODE3 to represent a residue of the combined sampled value with respect to a combination of CODE1 and CODE2. Switches 312P and switches 312M may configure a third segment of CDAC capacitor array 301P and CDAC capacitor array 301M as negative feedback for amplifier 318 to provide a factor of gain GAIN2 in a Step2 of a conversion cycle, and further to provide a factor of gain GAIN3 in a Step3 of a conversion cycle. A control circuit 101 may be similar or identical to control circuit 101 of FIG. 1. Control circuit 101 may provide a configuration signal CFG to switches 312P and switches 312M in accordance with a timing sequence, which may be similar or identical to a timing sequence shown in FIG. 2. Code M1 may configure switches 310P and switches 310M to drive a first segment of CDAC capacitor array 301P and CDAC capacitor array 301M. Code M2 may configure switches 311P and switches 311M to drive a second segment of CDAC capacitor array 301P and CDAC capacitor array 301M. A reference voltage circuit 107 may be configured to provide reference potentials VH and VL to switches 310P and switches 311P in a first polarity and to switches 310M and switches 311M in a second polarity opposite the first polarity. Alternatively and/or equivalently, in another embodiment, code M1 and code M2 may be applied to capacitor array 301P in the first polarity, and they may be applied to capacitor array 301M in the opposite second polarity. PHOSITA may be familiar with implementing and operating fully differential circuits, and they may recognize that ADC 300 of FIG. 3 may be a functionally equivalent fully differential implementation of a single-ended ADC 100 of FIG. 1.

In another embodiment (not shown), the present teachings may be combined with the teachings of U.S. Pat. No. 8,576,104, which is incorporated herein by reference. An objective of such a combination may be to allow a wide common-mode range for a differential input signal, such as VINP(t) and VINM(t) in FIG. 3. A first quantizer circuit ADC1 may be implemented as a pair of quantizers (not shown) generating a first-polarity code CODE1P and a second-polarity code CODE1M. The first-polarity code CODE1P may represent a combination of VINP(t) sampled at a sampling instance in combination with a first-polarity dither value that may be derived from a first-polarity dither code DXP. The second-polarity code CODE1M may represent a combination of VINM(t) sampled at the sampling instance in combination with a second-polarity dither value that may be derived from a second-polarity dither code DXM. Because VINP(t) and VINM(t) may be substantially different (for example, a common-mode component may vary considerably), CODE1P and CODE1M may be substantially different. A control circuit may be configured with a first-half and a second-half to process each single-ended conversion separately. For example, a control circuit may be implemented substantially as two instances of control circuit 101 of FIG. 1. Dither code DXP and dither code DXM may be, but need not be, independent of each other. One embodiment may be implemented substantially as two instances of ADC 100 in FIG. 1 configured to process and convert VINP(t) and VINM(t) independent of each other with the exception of CODE3. A fully differential residue amplifier circuit (not shown, compare to amplifier 318 and ADC2 of FIG. 3) may substitute each of the two amplifier circuits 118 in FIG. 1 in Step3 of a conversion cycle. CODE3 may be derived on a fully differential basis. CODE3 may be provided in a first polarity to the first-half control circuit used for converting of VINP(t) and in an opposite second polarity to the second-half control circuit used for the converting of VINM(t). The codes may be combined, used, and output in various ways as described in more detail in U.S. Pat. No. 8,576,104.

Example Implementations

The following examples are provided by way of illustration.

Example 1 may include a method for providing a digital output code to represent an analog input value, the method comprising sampling a combination of the analog input value and a dither value on a node of a capacitor array, deriving a first code approximating the combination of the analog input value and the dither value, applying a first segment of the first code to a first segment of the capacitor array, and applying a second segment of the first code to a second segment of the capacitor array, deriving a second code to represent a first residue of the combination of the analog input value and the dither value, the first residue being with respect to the first code applied to the capacitor array, combining a numerical value of the first code and a numerical value of the second code to derive a combined code, applying a first segment of the combined code to the first segment of the capacitor array, and applying a second segment of the combined code to the second segment of the capacitor array, wherein the first segment of the combined code and the second segment of the combined code are responsive to the second code, deriving a third code to represent a second residue of the combination of the analog input value and the dither value, the second residue being with respect to the combined code applied to the capacitor array, and combining the third code with the combined code and a dither code representing the dither value to provide the digital output code.

Example 2 may include the method of example 1, wherein applying the first segment of the first code to the first segment of the capacitor array includes encoding, by a mismatch-shaping encoder, the first segment of the first code.

Example 3 may include the method of example 1, wherein combining the numerical value of the first code and the numerical value of the second code includes adding the numerical value of the first code and the numerical value of the second code.

Example 4 may include the method of example 1, wherein sampling the combination of the analog input value and the dither value on the node of the capacitor array includes applying the dither code to the second segment of the capacitor array.

Example 5 may include the method of example 4, wherein the dither code comprises a plurality of substantially random-like bits.

Example 6 may include the method of example 4, further comprising deriving the dither code responsive to a combined code that was applied to the second segment of the capacitor array in a previous conversion cycle.

Example 7 may include the method of example 1, wherein deriving the second code includes amplifying the first residue.

Example 8 may include the method of example 1, wherein deriving the third code includes amplifying the second residue with a factor of gain having an absolute value of at least 250.

Example 9 may include the method of example 1, wherein the second segment of the combined code is a binary-weighted code.

Example 10 may include the method of example 1, wherein the first segment of the combined code is an equal-weighted code.

Example 11 may include the method of example 1, wherein a resolution of the first code is greater than a resolution of the first segment of the first code.

Example 12 may include the method of example 1, wherein the combining the third code with the combined code and the dither code includes utilizing mismatch information to calculate an estimate-weighted value of at least one bit of the combined code.

Example 13 may include the method of example 1, wherein the second residue is substantially not correlated with the analog input value.

Example 14 may include the method of example 1, wherein deriving the second code includes providing a successive-approximation analog-to-digital converter.

Example 15 may include the method of example 14, wherein a total capacitance of the successive-approximation analog-to-digital converter is less than 10 percent of a total capacitance of the capacitor array.

Example 16 may include the method of example 1, further comprising proving mismatch information including codes representing potential mismatch of a plurality of ratios of capacitors in the capacitor array.

Example 17 may include the method of example 1, wherein deriving the first code includes truncating the dither code.

Example 18 may include the method of example 1, wherein deriving the second code includes configuring a third segment of the capacitor array to provide negative feedback for an amplifier to provide a first factor of gain.

Example 19 may include the method of example 18, wherein deriving the third code includes configuring the third segment of the capacitor array to provide negative feedback for the amplifier to provide a second factor of gain, where an absolute value of the first factor of gain is smaller than an absolute value of the second factor of gain.

Example 20 may include the method of example 1, wherein deriving the first code includes providing a flash quantizer.

Example 21 may include one or more computer-readable media having instructions stored thereon, wherein the instructions, when executed by a control circuit, cause the control circuit to perform the methods of any of examples 1-20.

Example 22 may include an analog-to-digital converter (ADC) to perform the methods of any of examples 1-20, wherein the ADC includes any components disclosed throughout this disclosure to perform the method of any of examples 1-20.

Example 23 may include an analog-to-digital converter (ADC), comprising a capacitor array comprising a plurality of capacitors, and a control circuit coupled to the capacitor array, the control circuit to determine a first code based on a combination of an analog input value of the ADC and a dither value, the first code to approximate the combination of the analog input value and the dither value, cause a first segment of the first code to be applied to a first segment of the capacitor array, cause a second segment of the first code to be applied to a second segment of the capacitor array, determine a second code based on a first residue of the combination of the analog input value and the dither value, the first residue being with respect to the first code, and the second code to represent the first residue, combine a digital value of the first code and a digital value of the second code to produce a combined code, cause a first segment of the combined code to be applied to the first segment of the capacitor array, wherein the first segment of the combined code is responsive to the second code, cause a second segment of the combined code to be applied to the second segment of the capacitor array, wherein the second segment of the combined code is responsive to the second code, determine a third code to represent a second residue of the combination of the analog input value and the dither value, the second residue being with respect to the combined code applied to the capacitor array, and determine a digital output code based on the combined code and a dither code, the dither code to represent the dither value.

Example 24 may include the ADC of example 23, wherein the second segment of the combined code is a binary-weighted code.

Example 25 may include the ADC of example 23, wherein the first segment of the combined code is an equal-weighted code.

Example 26 may include the ADC of example 23, wherein a resolution of the first code is greater than a resolution of the first segment of the first code.

Example 27 may include the ADC of example 23, wherein to determine the digital output code includes to combine the third code with the combined code and the dither code.

Example 28 may include the ADC of example 27, wherein to combine the third code with the combined code and the dither code includes to utilize mismatch information to determine an estimate-weighted value of at least one bit of the combination code.

Example 29 may include the ADC of example 27, wherein the second residue is substantially not correlated with the analog input value.

Example 30 may include the ADC of example 23, wherein the control circuit is further to cause the combination of the analog input value and the dither value to be sampled on a node of the capacitor array.

Example 31 may include the ADC of example 23, further comprising a successive-approximation (SAR) ADC coupled to the control circuit, wherein the SAR ADC is to convert the combination of the analog input value and the dither value to digital, and provide the converted combination to the control circuit as the first code.

Example 32 may include the ADC of example 31, wherein a total capacitance of the SAR ADC is less than 10 percent of a total capacitance of the capacitor array.

Example 33 may include the ADC of example 23, wherein to determine the first code includes to truncate the dither code that is to represent the dither value.

Example 34 may include an analog-to-digital converter (ADC), comprising means for accumulating charge, means for applying codes to the means for accumulating charge, the means for applying codes to apply a first segment of a first code to a first segment of the means for accumulating charge, apply a second segment of the first code to a second segment of the means for accumulating charge, apply a first segment of a combined code to the first segment of the means for accumulating charge, wherein the first segment of the combined code is responsive to a second code, and apply a second segment of the combined code to the second segment of the means for accumulating charge, wherein the second segment of the combined code is responsive to the second code, and means for controlling operation of the ADC to determine the first code that approximates a combination of an analog input value and a dither value, determine the second code to represent a first residue of the combination of the analog input value and the dither value, the first residue being with respect to the first code applied to the means for accumulating charge, determine a third code to represent a residue of the combination of the analog input value and the dither value with respect to the combined code applied to the means for accumulating charge, and produce a digital output code by combination of the third code with the combined code and a dither code that represents the dither value.

Example 35 may include the ADC of example 34, wherein the means for controlling operation of the ADC is further to cause the combination of the analog input value and a dither value to be sampled on a node of the means for accumulating charge.

Example 36 may include the ADC of example 34, further comprising a means for converting analog to digital to convert the analog input value to digital, and provide the converted analog input value to the means for controlling operation of the ADC for determination of the first code.

Example 37 may include the ADC of example 36, wherein a total capacitance of the means for converting analog to digital is less than 10 percent of a total capacitance of the means for accumulating charge.

Example 38 may include the ADC of example 34, wherein to determine the first code includes to truncate the dither code that is to represent the dither value.

The foregoing outlines features of one or more embodiments of the subject matter disclosed herein. These embodiments are provided to enable a person having ordinary skill in the art (PHOSITA) to better understand various aspects of the present disclosure. Certain well-understood terms, as well as underlying technologies and/or standards may be referenced without being described in detail. It is anticipated that the PHOSITA will possess or have access to background knowledge or information in those technologies and standards sufficient to practice the teachings of the present disclosure.

The PHOSITA will appreciate that they may readily use the present disclosure as a basis for designing or modifying other processes, structures, or variations for carrying out the same purposes and/or achieving the same advantages of the embodiments introduced herein. The PHOSITA will also recognize that such equivalent constructions do not depart from the spirit and scope of the present disclosure, and that they may make various changes, substitutions, and alterations herein without departing from the spirit and scope of the present disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The particular embodiments of the present disclosure may readily include a system on chip (SoC) central processing unit (CPU) package. An SoC represents an integrated circuit (IC) that integrates components of a computer or other electronic system into a single chip. It may contain digital, analog, mixed-signal, and radio frequency functions: all of which may be provided on a single chip substrate. Other embodiments may include a multi-chip-module (MCM), with a plurality of chips located within a single electronic package and configured to interact closely with each other through the electronic package. Any module, function, or block element of an ASIC or SoC can be provided, where appropriate, in a reusable "black box" intellectual property (IP) block, which can be distributed separately without disclosing the logical details of the IP block. In various other embodiments, the digital signal processing functionalities may be implemented in one or more silicon cores in application-specific integrated circuits (ASICs), field-programmable gate arrays (FPGAs), and other semiconductor chips.

In some cases, the teachings of the present disclosure may be encoded into one or more tangible, non-transitory computer-readable mediums having stored thereon executable instructions that, when executed, instruct a programmable device (such as a processor or DSP) to perform the methods or functions disclosed herein. In cases where the teachings herein are embodied at least partly in a hardware device (such as an ASIC, IP block, or SoC), a non-transitory medium could include a hardware device hardware-programmed with logic to perform the methods or functions disclosed herein. The teachings could also be practiced in the form of Register Transfer Level (RTL) or other hardware description language such as VHDL or Verilog, which can be used to program a fabrication process to produce the hardware elements disclosed.

Computer program logic implementing all or part of the functionality described herein is embodied in various forms, including, but in no way limited to, a source code form, a computer executable form, a hardware description form, and various intermediate forms (for example, mask works, or forms generated by an assembler, compiler, linker, or locator). In an example, source code includes a series of computer program instructions implemented in various programming languages, such as an object code, an assembly language, or a high-level language such as OpenCL, RTL, Verilog, VHDL, Fortran, C, C++, JAVA, or HTML for use with various operating systems or operating environments. The source code may define and use various data structures and communication messages. The source code may be in a computer executable form (for example, via an interpreter), or the source code may be converted (for example, via a translator, assembler, or compiler) into a computer executable form.

In one example embodiment, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In another example embodiment, the electrical circuits of the FIGURES may be implemented as standalone modules (for example, a device with associated components and circuitry configured to perform a specific application or function) or implemented as plug-in modules into application-specific hardware of electronic devices.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this disclosure. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, applicant wishes to note that the applicant: (a) does not intend any of the appended claims to invoke 35 U.S.C. § 112(f) as it exists on the date of the filing hereof unless the words "means for" or "steps for" are specifically used in the particular claims; and (b) does not intend, by any statement in the disclosure, to limit this disclosure in any way that is not otherwise reflected in the appended claims.

What is claimed is:

1. A method for providing a digital output code to represent an analog input value, the method comprising:
sampling a combination of the analog input value and a dither value on a node of a capacitor array;
deriving a first code approximating the combination of the analog input value and the dither value;
applying a first segment of the first code to a first segment of the capacitor array, and applying a second segment of the first code to a second segment of the capacitor array;
deriving a second code to represent a first residue of the combination of the analog input value and the dither value, the first residue being with respect to the first code applied to the capacitor array;
combining a numerical value of the first code and a numerical value of the second code to derive a combined code;
applying a first segment of the combined code to the first segment of the capacitor array, and applying a second segment of the combined code to the second segment of the capacitor array, wherein the first segment of the combined code and the second segment of the combined code are responsive to the second code;
deriving a third code to represent a second residue of the combination of the analog input value and the dither value, the second residue being with respect to the combined code applied to the capacitor array; and
combining the third code with the combined code and a dither code representing the dither value to provide the digital output code.

2. The method of claim 1, wherein applying the first segment of the first code to the first segment of the capacitor array includes encoding, by a mismatch-shaping encoder, the first segment of the first code.

3. The method of claim 1, wherein combining the numerical value of the first code and the numerical value of the second code includes adding the numerical value of the first code and the numerical value of the second code.

4. The method of claim 1, wherein sampling the combination of the analog input value and the dither value on the node of the capacitor array includes applying the dither code to the second segment of the capacitor array.

5. The method of claim 4, wherein the dither code comprises a plurality of substantially random-like bits.

6. The method of claim 4, further comprising deriving the dither code responsive to a combined code that was applied to the second segment of the capacitor array in a previous conversion cycle.

7. The method of claim 1, wherein deriving the second code includes amplifying the first residue.

8. The method of claim 1, wherein deriving the third code includes amplifying the second residue with a factor of gain having an absolute value of at least 250.

9. An analog-to-digital converter (ADC), comprising:
a capacitor array comprising a plurality of capacitors; and
a control circuit coupled to the capacitor array, the control circuit to:
determine a first code based on a combination of an analog input value of the ADC and a dither value, the first code to approximate the combination of the analog input value and the dither value;
cause a first segment of the first code to be applied to a first segment of the capacitor array;
cause a second segment of the first code to be applied to a second segment of the capacitor array;
determine a second code based on a first residue of the combination of the analog input value and the dither value, the first residue being with respect to the first code, and the second code to represent the first residue;

combine a digital value of the first code and a digital value of the second code to produce a combined code;

cause a first segment of the combined code to be applied to the first segment of the capacitor array, wherein the first segment of the combined code is responsive to the second code;

cause a second segment of the combined code to be applied to the second segment of the capacitor array, wherein the second segment of the combined code is responsive to the second code;

determine a third code to represent a second residue of the combination of the analog input value and the dither value, the second residue being with respect to the combined code applied to the capacitor array; and determine a digital output code based on the combined code and a dither code, the dither code to represent the dither value.

10. The ADC of claim 9, wherein the second segment of the combined code is a binary-weighted code.

11. The ADC of claim 9, wherein the first segment of the combined code is an equal-weighted code.

12. The ADC of claim 9, wherein a resolution of the first code is greater than a resolution of the first segment of the first code.

13. The ADC of claim 9, wherein to determine the digital output code includes to combine the third code with the combined code and the dither code.

14. The ADC of claim 13, wherein to combine the third code with the combined code and the dither code includes to utilize mismatch information to determine an estimate-weighted value of at least one bit of the combination code.

15. The ADC of claim 13, wherein the second residue is substantially not correlated with the analog input value.

16. An analog-to-digital converter (ADC), comprising:
means for accumulating charge;
means for applying codes to the means for accumulating charge, the means for applying codes to:
apply a first segment of a first code to a first segment of the means for accumulating charge;
apply a second segment of the first code to a second segment of the means for accumulating charge;
apply a first segment of a combined code to the first segment of the means for accumulating charge, wherein the first segment of the combined code is responsive to a second code; and
apply a second segment of the combined code to the second segment of the means for accumulating charge, wherein the second segment of the combined code is responsive to the second code; and means for controlling operation of the ADC to:
determine the first code that approximates a combination of an analog input value and a dither value;
determine the second code to represent a first residue of the combination of the analog input value and the dither value, the first residue being with respect to the first code applied to the means for accumulating charge;
determine a third code to represent a residue of the combination of the analog input value and the dither value with respect to the combined code applied to the means for accumulating charge; and
produce a digital output code by combination of the third code with the combined code and a dither code that represents the dither value.

17. The ADC of claim 16, wherein the means for controlling operation of the ADC is further to:
cause the combination of the analog input value and the dither value to be sampled on a node of the means for accumulating charge.

18. The ADC of claim 16, further comprising a means for converting analog to digital to:
convert the analog input value to digital; and
provide the converted analog input value to the means for controlling operation of the ADC for determination of the first code.

19. The ADC of claim 18, wherein a total capacitance of the means for converting analog to digital is less than 10 percent of a total capacitance of the means for accumulating charge.

20. The ADC of claim 16, wherein to determine the first code includes to truncate the dither code that is to represent the dither value.

* * * * *